(12) United States Patent
Lodahl et al.

(10) Patent No.: US 11,309,684 B2
(45) Date of Patent: Apr. 19, 2022

(54) COHERENT SINGLE PHOTON SOURCE

(71) Applicant: Københavns Universitet, Copenhagen K (DK)

(72) Inventors: Peter Lodahl, Birkerød (DK); Chris Lennart Dreessen, Copenhagen S (DK); Petru Tighineanu, Erlangen (DE); Anders Søndberg Sørensen, Rødovre (DK); Leonardo Midolo, Copenhagen Ø (DK)

(73) Assignee: Københavns Universitet, Copenhagen K (DK)

( * ) Notice: Subject to any disclaimer, the term of this patent is extended or adjusted under 35 U.S.C. 154(b) by 365 days.

(21) Appl. No.: 16/614,578

(22) PCT Filed: May 18, 2018

(86) PCT No.: PCT/DK2018/050115
§ 371 (c)(1),
(2) Date: Nov. 18, 2019

(87) PCT Pub. No.: WO2018/210394
PCT Pub. Date: Nov. 22, 2018

(65) Prior Publication Data
US 2020/0112139 A1    Apr. 9, 2020

(30) Foreign Application Priority Data

May 19, 2017   (DK) .......................... PA 2017 70357

(51) Int. Cl.
*H01S 5/10* (2021.01)
*H01S 5/34* (2006.01)
(Continued)

(52) U.S. Cl.
CPC ............ *H01S 5/1014* (2013.01); *B82Y 20/00* (2013.01); *G02B 6/107* (2013.01); *H01S 5/1042* (2013.01);
(Continued)

(58) Field of Classification Search
CPC ........ H01S 5/1014; H01S 5/11; H01S 5/1042; H01S 5/3412; H01S 5/34313;
(Continued)

(56) References Cited

U.S. PATENT DOCUMENTS

| | | | |
|---|---|---|---|
| 9,554,738 B1* | 1/2017 | Gulati | A61B 5/0075 |
| 10,379,050 B2* | 8/2019 | Geddes | G01N 33/553 |
| 11,001,875 B2* | 5/2021 | Rothberg | C12Q 1/6869 |

FOREIGN PATENT DOCUMENTS

| | | |
|---|---|---|
| EP | 2202550 B1 | 9/2011 |
| GB | 2482596 A | 2/2012 |

OTHER PUBLICATIONS

Arcari, M. et al., "Near-Unity Coupling Efficiency of a Quantum Emitter to a Photonic Crystal Waveguide" Physical Review Letters, Aug. 2014, vol. 113, No. 9, 093603-1-093603-5.
(Continued)

*Primary Examiner* — Nicole M Ippolito
(74) *Attorney, Agent, or Firm* — Knobbe Martens Olson & Bear LLP

(57) ABSTRACT

The invention relates to coherent single photon sources that provide photons with a high degree of indistinguishability. It is a disadvantage of single photon sources based on QDs in nanophotonic structures that, even at low temperatures, acoustic vibrations interact with the QDs to reduce the coherence of the emitted spectrum. The invention uses mechanical clamping of the nanostructure to damp vibrations leading to a weaker QD—phonon coupling and a higher degree of indistinguishability between successively
(Continued)

emitted photons. The clamp is mechanically connected to the length of the photonic nanostructure and has a stiffness and a size sufficient to suppress low frequency vibrations ($\omega \leq 10$ GHz) in a combined structure of the clamp and the nanostructure.

10 Claims, 4 Drawing Sheets

(51) Int. Cl.
  *H01S 5/11* (2021.01)
  *B82Y 20/00* (2011.01)
  *G02B 6/10* (2006.01)
  *H01S 5/02* (2006.01)
  *H01S 5/343* (2006.01)

(52) U.S. Cl.
  CPC .............. *H01S 5/11* (2021.01); *H01S 5/3412* (2013.01); *H01S 5/34313* (2013.01); *H01S 5/021* (2013.01); *H01S 5/0218* (2013.01); *H01S 2301/16* (2013.01)

(58) Field of Classification Search
  CPC .... H01S 5/021; H01S 5/0218; H01S 2301/16; B82Y 20/00; G02B 6/107
  USPC .............................................. 250/251, 493.1
  See application file for complete search history.

(56) References Cited

OTHER PUBLICATIONS

He, Yu-Ming et al., "On-demand semiconductor single-photon source with near-unity indistinguishability" Nature Nanotechnology, Mar. 2013, pp. 213-2017, vol. 8.
Kalliakos, Sokratis et al., "On-chip generation and in-plane transmission of indistinguishable photons" Visual Communications and Image Processing, Mar. 2015, vol. 9357, 935718-1-935718-7.
Kirsanske, Gabija et al., "Indistinguishable and efficient single photons from a quantum dot in a planar nanobeam waveguide" ArXiv.org, Cornell University Library, Jan. 2017, pp. 1-11, XP080752077.
Lodahl, Peter et al., "Interfacing single photons and single quantum dots with photonic nanostructures" Dec. 2013, pp. 1-57. http://arxiv.org/abs/1312.1079, XP055158721.
Somaschi, N. et al., "Near-optimal single-photon sources in the solid state" Nature Photonics, May 2016, pp. 340-345, vol. 10.
International Preliminary Report on Patentability for PCT/DK2018/050015 dated Nov. 19, 2019.
International Search Report for PCT/DK2018/0500115 dated Aug. 21, 2018.

\* cited by examiner

COHERENT SINGLE PHOTON SOURCE

CROSS REFERENCE TO RELATED APPLICATIONS

This application is a U.S. National Phase Application of PCT International Application Number PCT/DK2018/050115, filed on May 18, 2018, designating the United States of America and published in the English language, which is an International Application of and claims the benefit of priority to Danish Patent Application No. PA 2017 70357, filed on May 19, 2017. The disclosures of the above-referenced applications are hereby expressly incorporated by reference in their entireties.

FIELD OF THE INVENTION

The invention relates to single photon sources, in particular coherent single photon sources that provide photons with a high degree of indistinguishability.

BACKGROUND OF THE INVENTION

Coherent single photon sources are of particular interest in quantum information applications, where photons are one promising carrier of quantum information.

Here, a high degree of indistinguishability of the emitted photons is an essential requirement.

Quantum dots (QDs) represent a promising system for efficient and high-rate generation of single photons by embedding a QD in a photonic nanostructure. In order to achieve highly coherent single photons, decoherence processes induced by stochastic thermal motion of the waveguide need to be eliminated.

Subsequently the generated coherent photons are coupled out of the photonic nanostructure for applications.

SUMMARY OF THE INVENTION

It is an object of the invention to provide a coherent single photon source that can generate, capture and transport photons in a controlled way while maintaining a high degree of indistinguishability.

It is another object of the invention to provide a coherent single photon source having both a high coupling rate from a single-photon emitter to a photonic nanostructure and a high indistinguishability between subsequently emitted photons.

The following description of problems and disadvantages with prior art devices is presented to explain the inventive features of the present invention, their underlying mechanisms, and their advantages. The description contains realizations and insights from the inventors related to the conception of the invention, and should not be used in an ex-post facto analysis for deducing the invention.

A certain class of prior art efficient single photon sources are QDs in a nanophotonic waveguide, see e.g. Arcari et al. Near-Unity Coupling Efficiency of a Quantum Emitter to a Photonic Crystal Waveguide, Physical Review Letters 113, 093603 (2014). In this work indistinguishability of single photons was not achieved. Here, the following notation for the coupling from the QD to waveguide mode is introduced:

$$\beta=\Gamma_{wg}/(\Gamma_{wg}+\Gamma_{rad}+\Gamma_{nr}),$$

which gives the probability for a single exciton in the QD to recombine by emitting a single photon into the waveguide mode. $\Gamma_{wg}$ and $\Gamma_{rad}$ are the rate of decay of the QD into either the guided mode or nonguided radiation modes, whereas $\Gamma_{nr}$ denotes the intrinsic nonradiative decay rate of the QD. This notation will also be used in the present description. The reported near unity coupling efficiency from the QD to the waveguide (above 98.4%) requires that the waveguide is single mode and that coupling from the QD to radiation modes is strongly inhibited. This implies that suspended or free-standing nanophotonic waveguides are used to maximise the refractive index step to surrounding media. The high coupling efficiency is required to obtain a single photon source that is efficient, i.e. that the source will produce and transmit a single photon close to 100% of the times the QD is excited.

Important dephasing mechanisms relevant for single photon generation from QDs are the fluctuating electrostatic environment and the field of nuclear spins, but these processes can be strongly suppressed and are furthermore so slow that they generally do not influence the indistinguishability of the emitted photon over short time scales (up to milliseconds). The remaining and most important decoherence process is then the acoustic vibrations of the crystal lattice (phonons) of the waveguide, which are known to be temperature dependent, but a quantitative insight into their impact on the photon coherence has been lacking. Existing models hold only for QDs embedded in a homogeneous medium, but photonic nanostructures used for single photon sources are not homogeneous and therefore constitute an inhomogeneous acoustic environment as well. The influence of the latter to photon coherence is largely unknown. It is therefore a disadvantage of single photon sources based on QDs in nanophotonic structures that, even at low temperatures (few Kelvin), acoustic vibrations interact with the QDs to reduce the coherency of the emitted spectrum.

The coherency of such sources could be improved by using larger waveguides with vibrational modes having a weaker interaction with the QDs. This, however, would be disadvantageous since the waveguide would not be single mode anymore, thus the coupling efficiency to one desired mode suffers.

The gist of the invention is to use QDs in photonic nanostructures that provides the reported high coupling efficiency from QDs to the nanostructure, and use clamping of the nanostructure to damp vibrations leading to a weaker QD—phonon coupling and a higher degree of indistinguishability between successively emitted photons.

In a first aspect, the invention provides a coherent single photon source with wavelength λ, comprising an elongated, semiconductor photonic nanostructure and a self-assembled quantum dot positioned inside the photonic nanostructure, wherein the photonic nanostructure has a cross-sectional area smaller than 2 μm². The single photon source further comprises an elongated clamp formed in a material that is transparent and has a refractive index smaller than 2 at the wavelength λ, wherein the clamp is mechanically connected to the length of the photonic nanostructure and has a stiffness and a size sufficient to suppress low frequency vibrations (ω≤10 GHz) in a combined structure of the clamp and the nanostructure.

Similarly, in a second aspect, the invention provides a method for improving the indistinguishability of a single photon source having an elongated, semiconductor photonic nanostructure and a self-assembled quantum dot positioned inside the photonic nanostructure, wherein the photonic nanostructure has a cross-sectional area smaller than 2 µm², the method comprising the steps of:
- exciting the quantum dot to emit photons; and
- increasing the indistinguishability of photons successively emitted into the photonic nanostructure with a clamp formed in a clamping material that is transparent and has a refractive index smaller than 2 at the wavelength λ, the clamp being mechanically connected to the length of the photonic nanostructure and having a stiffness and a size sufficient to suppress low frequency vibrations ($\omega \leq 10$ GHz) in a combined structure of the clamp and the nanostructure.

Clamping the nanostructure with another material may be used to damp vibrations and thus increase indistinguishability. But, such clamping material, even when it has a low refractive index, means a lower index-step and thus increased radiation losses, $\Gamma_{rad}$, and lower coupling efficiency, $\beta$. It turns out, however, that the reduction in coupling efficiency is small whereas improvement in photon indistinguishability is large so that a single photon source that is both efficient and coherent can be designed.

The quantum dot is a self-assembled quantum dot, preferably made of indium arsenide embedded in gallium arsenide.

The QD is positioned within a photonic nanostructure, which in this description can be a cavity or a waveguide having a cross-sectional area, a, smaller than 2 µm², such as smaller than 1.5 µm² or preferably smaller than 1 µm². A comprehensive description of various photonic nanostructures commonly used in the field and which may be used in embodiments of the present invention is given in Lodahl et al., Interfacing single photons and single quantum dots with photonic nanostructures, Reviews of Modern Physics 87, 347 (2015), Chapter III.

The photonic nanostructure is either a single mode nanophotonic waveguide for the wavelength of the emitted photons or a nanophotonic cavity. In a preferred embodiment, the photonic nanostructure is a nanophotonic waveguide that is single-mode at the wavelength λ. Preferably, a single-mode nanophotonic waveguide is defined by a cross-sectional area of the waveguide, a, fulfilling the condition: $a<0.07*\lambda^2$ corresponding to a diameter smaller than $0.3\lambda$ for circular nanostructures. Here λ is the central free space wavelength of the emitted photon. This ensures that the waveguide is single-mode, which again increases the coupling efficiency to the desired mode. In another preferred embodiment, the photonic nanostructure is a nanophotonic cavity. Preferably, a nanophotonic cavity is defined as having a mode-volume $V<10*(\lambda/n)^3$, where n is the refractive index of the material holding the QD, and a quality factor $Q>500$.

The clamp damps the acoustic (low frequency, $\omega \leq 10$ GHz) vibrations in the photonic nanostructure by increasing the volume of the combined structure; the photonic nanostructure and the clamp. The damping of the vibrations leads to a higher indistinguishability of the generated photons of at least 99% at T=1.6 K.

In a preferred embodiment, the stiffness and size of the clamp is adjusted to provide a photon indistinguishability of at least 97%, or at least 98%, such as preferably at least 99% between emitted photons from the source.

The vibrational properties of the clamp and/or of the combined structure is mainly determined by the clamping material (in particular its stiffness) and the geometry of the clamp (i.e. its size and layout around the nanostructure). An analytical expression for the stiffness and size required to obtain a given indistinguishability cannot be obtained. Instead, simulations using preferred materials and geometries are performed to arrive at designs providing a desired indistinguishability. Table 1 below summarizes the results of computer simulations looking for the cross sectional area of the combined structure, A, that leads to an indistinguishability of 99% at a temperature of 1.6K. The simulation used a geometrical model similar to that of FIG. 1B. The simulations were performed for four preferred clamping materials, BCB, SU8, $SiO_2$ and $Si_3Ni_4$ using a GaAs waveguide. These four were selected since they have Young's moduli in different ranges and are thus representative of a wide range of possible materials. Since the clamping material and the waveguide have different stiffness, represented by their different Young's moduli, there is also a weighted averaged Young's modulus in the table. Several expressions where tested with the goal of finding a single key parameter indicative of the required stiffness and size of the clamp, and a few are listed in the bottom lines of the table.

TABLE 1

| T = 1.6K | BCB | SU8 | SiO2 | Si3N4 | GaAs waveguide (175 nm*300 nm) |
|---|---|---|---|---|---|
| Material parameter | | | | | |
| Density [Kg/m³] | 1050 | 1200 | 2200 | 3180 | 5320 |
| Poisson's ratio | 0.34 | 0.22 | 0.17 | 0.24 | 0.31 |
| Young's modulus, E [GPa] | 2.5 | 4.95 | 70 | 250 | 85.9 |
| Area of combined structure, A, for Indistinguishability of 99% [µm²] | 10.89 | 7.29 | 1 | 0.4761 | (0.05) |
| Averaged Young's modulus for clamping material + GaAs, $E_{av}$ [GPa] | 2.90 | 5.53 | 70.83 | 231.90 | |
| Possible key parameter | | | | | |
| E*A | 27.23 | 36.09 | 70 | 119.03 | |
| $E^{3/2}$*A | 43.05 | 80.29 | 585.66 | 1881.95 | |
| $E_{av}$*A | 31.60 | 40.34 | 70.83 | 110.41 | |
| $E_{av}^{3/2}$*A | 53.84 | 94.88 | 596.17 | 1681.37 | |

Since no single key parameter indicative of the required stiffness and size of the clamp was found, the invention may be characterized in that an averaged Young's modulus for the nanostructure material and the clamping material, $E_{av}$, and a cross-sectional area of the combined structure, A, be selected in accordance with:

for $E_{av} \in [0$ GPa$; 3$ GPa$[$, $A \geq 10.5$ μm$^2$;
for $E_{av} \in [3$ GPa$; 5.5$ GPa$[$, $A \geq 7$ μm$^2$;
for $E_{av} \in [5.5$ GPa$; 70$ GPa$[$, $A \geq 1$ μm$^2$;
for $E_{av} \geq 70$ GPa, $A \geq 0.5$ μm$^2$.

For a given photonic nanostructure and clamping material, these relations give minimum cross-sectional areas of the combined structure (and thus also the size of the clamp) required to achieve a high photon indistinguishability. Similarly, for a desired size of the clamp, the relations specify a stiffness (expressed by Young's modulus) of the clamping material needed to achieve a high photon indistinguishability. The simulations leading to these relations set a photon indistinguishability of 99%. The fabrication of early physical prototypes of single photon sources according to the invention is on the way. In the first prototype devices we expect to reach indistinguishability of 99% at T=1.6 K that we expect to extend to increased temperatures of T=4 K when optimising the device design.

The clamp is mechanically connected to the length of the photonic nanostructure. By this is meant the length of a section of the nanostructure in which the QD is positioned and in which vibrations interact with excitons of the QD. As well understood by the skilled person, in embodiments where the nanostructure is very long or consists of several sections with different functionalities, sections of the nanostructure very distant from the QD need not be mechanically connected to the clamp as vibrations in these sections will not affect the QD.

In the following, a number of preferred and/or optional features, elements, examples and implementations will be summarized. Features or elements described in relation to one embodiment or aspect may be combined with or applied to the other embodiments or aspects where applicable. For example, structural and functional features applied in relation to the lens assembly also be used as features in relation to the method and vice versa The wavelength λ preferably lies in the interval 400-1600 nm (values for n=1, vacuum).

The photonic nanostructure is formed in a semiconductor material, such as preferably GaAs alternatively AlGaAs or InP.

The four preferred clamping materials already mentioned were also selected based on them being suitable for use in microfabrication processes. Other possible materials could be photoresist or other epoxy resins.

The clamping material should have a lower index than the material of the nanostructure in order to not induce too high radiation losses. Preferably, the clamping material has a refractive index at the wavelength λ in the interval 1-2, such as preferably 1.4-1.7.

The density of a material typically follows its stiffness—the higher density, the higher the Young's modulus. Nonetheless, there are variations from this rule of thumb. It is preferred that the clamping material, while having a high Young's 30 modulus as defined above, has a low density, such as below 3500 kg/m$^3$ or preferably below 2500 kg/m$^3$.

For a given nanostructure, a high Poisson ratio of the clamping material is preferred, such as above 0.15 or preferably above 0.3 or even above 0.4 or preferably 0.5 so that QDs do not change volume inside the nanostructure when the structure is strained.

The geometry of the clamp is to a large degree determined by the type and material of the photonic nanostructure and the compatible microfabrication techniques. In a preferred embodiment, the clamp at least partly surrounds the photonic nanostructure in transverse directions. By this, it is meant that the clamping material has a substantial thickness on at least three sides of the nanostructure or in at least three transverse directions from the nanostructure. In another preferred embodiment, the photonic nanostructure is embedded in the clamp in transverse directions. By this, it is mean that the clamping material has a substantial thickness on all sides of, or in all directions from, the nanostructure. A non-exhaustive set of exemplary geometries are illustrated in FIG. 1 A-J, showing cross-sectional views of the photonic nanostructure (dark grey) and the clamp (light grey).

Prior art photonic nanostructures for single photon sources are suspended from or freely standing on a supporting structure, i.e. a wafer or a chip. The photonic nanostructures used in the invention are preferably suspended or freely standing until the addition of the clamp. In a preferred embodiment, the clamp forms an additional mechanical connection between the, otherwise suspended or freely standing, photonic nanostructure and the supporting structure. Such additional mechanical connection provides the advantage of further suppressing the acoustic vibrations in the nanostructure. When forming such additional mechanical connection, care should be taken to keep the distances between the nanostructure and the supporting structure so large that the addition of the clamp does not enable evanescent coupling of radiation from the nanostructure to the supporting structure.

In the above, relations between averaged Young's modulus, $E_{av}$, and cross-sectional area, A, necessary to obtain 99% indistinguishability was derived from the simulation results using the geometry of FIG. 1B. Other of the geometries illustrated in FIG. 1 are expected to provide better damping of the vibrations than 1B, the one used in the simulations. As previously mentioned, it may be preferred that the nanostructure is embedded in the clamp such as in the geometries 1C, 1E, 1F, and 1G, as these are expected to provide a larger suppression of the acoustic vibrations. It is therefore expected that simulations of these geometries would produce relations between $E_{av}$ and A that are narrower, i.e. lies within, those for the geometry of FIG. 1B. It should be noted that for implementations for commercial use, the performance in damping vibrations is not the only parameter to be considered; others such as ease of fabrication, mechanical stability, price, compatibility with other components etc. also plays a role when evaluating the best mode of implementation.

FIGS. 1H, 1I and 1J are special in that they illustrate nanostructures that are defect regions in photonic crystal membranes. Photonic crystal nanostructures are advantageous since they provide almost perfect confinement in the in-plane directions, since in-plane vibrational components are naturally damped by the increased size of the structures. Furthermore, they are easier to clamp without decreasing the coupling efficiency, since the clamping material can be deposited on the side of the membrane separated from the waveguide structure.

Thus, in a preferred embodiment, the photonic nanostructure is a defect region in a photonic crystal membrane, and the clamp comprises two layers of clamping material sandwiching the photonic crystal membrane.

The primary goal of the invention is to have photons generated and coupled to the nanostructure with high efficiency and indistinguishability. A secondary goal is then to transmit the photons to other devices while maintaining the high efficiency (i.e. without losing many photons) and indistinguishability. Therefore, the coherent single photon source preferably further comprises means for coupling out photons emitted by the quantum dot in the photonic nanostructure. In a preferred embodiment, the means for coupling out photons is a single mode nanophotonic waveguide section being an extension of the photonic nanostructure and which is mechanically connected to the clamp along its length and at least partly surrounded by the clamp in transverse directions, the waveguide section being tapered in a direction away from the nanostructure to evanescently couple photons from the single mode to a guided mode in the clamp.

The QD can be excited by means of electronic or optical pulses, these being well described in the prior art. In a preferred embodiment, the single photon source further comprises means for coupling in photons to excite the QD in the photonic nanostructure.

DETAILED DESCRIPTION OF THE INVENTION

Cross-sectional views of a number of different exemplary geometries are shown in FIGS. 1A-J, where the dark-grey areas are the nanostructure 1 and the light grey are the clamp 2. These illustrates only the nano-structure-clamp geometry and applies to a large number of different nanostructures as described in the following.

The photonic nanostructure used in the invention may be a nanophotonic cavity or a nanophotonic waveguide. Typical photonic nanostructures with can be used in the present invention are for example:

A micropillar cavity where a Bragg stack above and below the center of the pillar confines light to a central region holding a QD, or a photonic nanowire holding a QD. In prior art devices, the pillar or wire is freely standing to maximize the coupling efficiency from the QD and the photon is coupled vertically out of the structure. In an embodiment according to the invention, clamping material would be formed around the pillar/wire to at least partly surround it.

Figure 1:
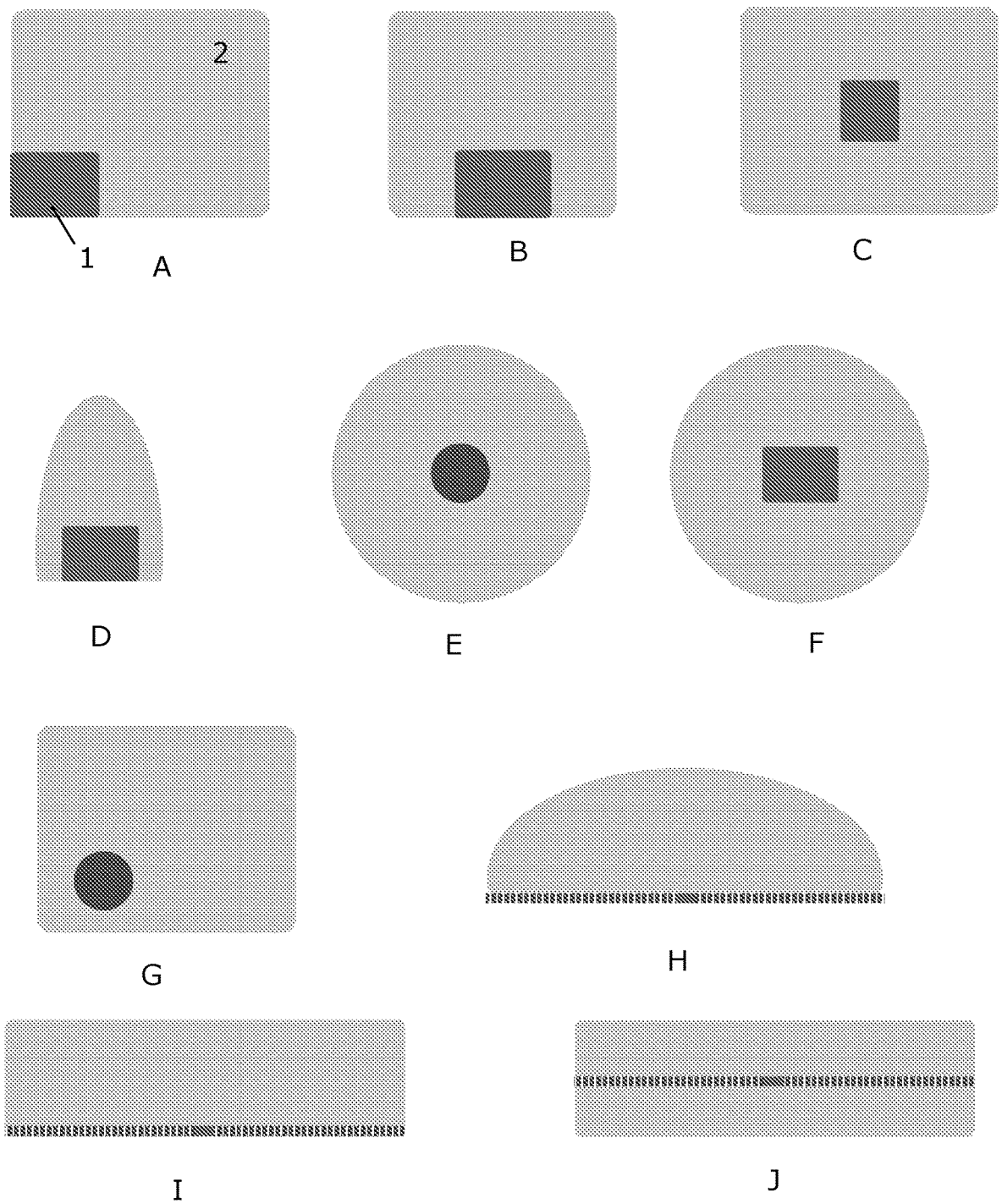
FIGS. 1A-J illustrate exemplary cross-sectional geometries of the photonic nanostructure and the clamp.

A photonic crystal cavity or waveguide implemented in a membrane, where the photonic band gap localizes light (in the in-plane dimensions) in the defect region holding the QD. In the prior art, photonic crystal membranes holding QD's are suspended to maximize the refractive index step and thus the out-of-plane confinement. In the present invention, the photonic crystal membrane would be supported by a clamp or sandwiched between two clamp layers. FIGS. 1H, 1I and 1J illustrate such photonic crystal membranes where the dark-grey area has a perforated crystal region and a central defect region.

A nanobeam cavity or waveguide where a narrow membrane provides confinement in both transverse dimensions. Longitudinal confinement can be provided by a 1D Bragg grating in the beam in the case of a cavity. In prior art nanobeams holding QD's, the beams are suspended to maximize the refractive index step and thus the transverse confinement. In the present invention, the beam would be supported by a clamp, sandwiched between two clamp layers, or completely embedded in a clamp.

The above photonic nanostructures are examples, and other existing or future nanostructures may also be used in embodiments of the invention.

In an embodiment of the invention, the photonic nanostructure is a rectangular GaAs waveguide slab with transverse dimensions 300 nm×175 nm partly enclosed in a clamp formed in SU8 (epoxy resin) with a geometry as shown in FIG. 1B.

Figure 2:
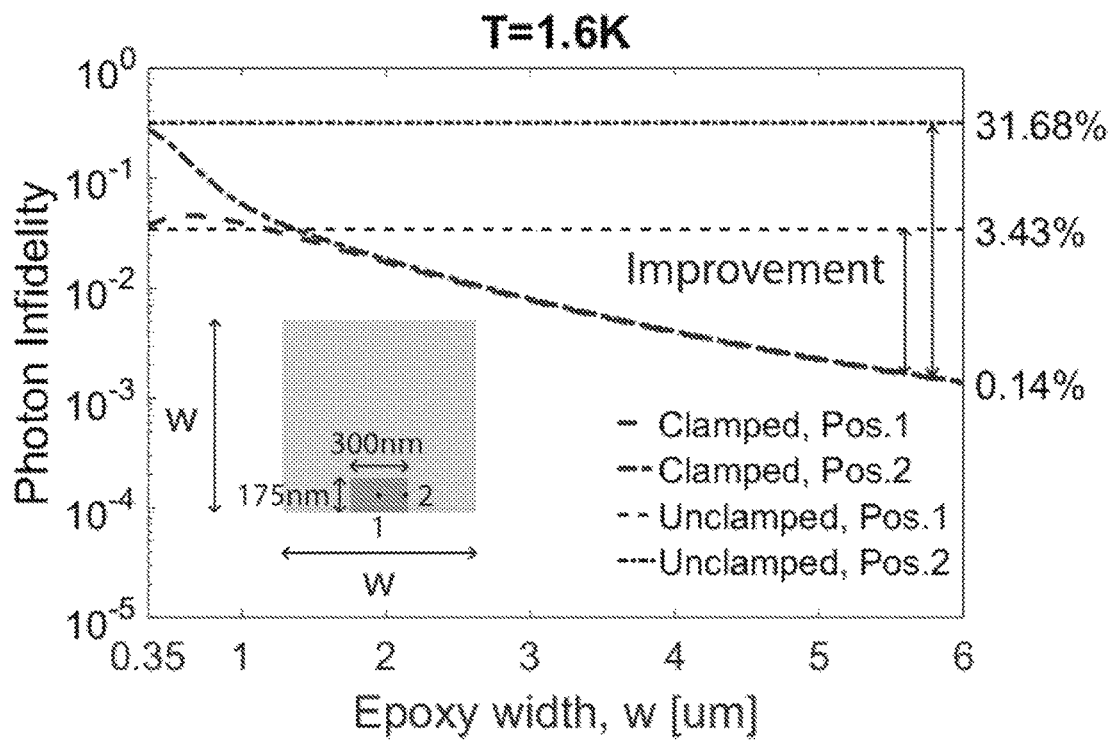
FIG. 2 is a graph illustrating simulated photon infidelity, a measure of photon distinguishability, as a function of the thickness of the clamp or without clamp for different positions of the QD inside the waveguide. The clamping material is exemplarily chosen to be SU8.

Computer simulations have been performed using this embodiment, and the graph in FIG. 2 shows photon infidelity (1 minus the degree of photon indistinguishability) for photons emitted by a QD in the waveguide as a function of the transverse dimensions, W, of the clamp. As can be seen, the indistinguishability increases with increasing clamp dimensions, which is assigned to the increased volume of the combined structure and thus increases suppression of low acoustic vibrations interacting with the QD excitons.

The graph of FIG. 2 also shows the photon infidelity for the waveguide without clamps (no dependency of clamp dimensions), which naturally coincides with that of clamp dimensions W=0 μm.

The photon infidelity—with and without clamp—is simulated for two different positions of the QD in the waveguide, on at the centre and one at the edge. In prior art devices with QDs in nanophotonic waveguides without a clamp, a large dependency of the coupling upon the position of the QD in the waveguide is observed, with poorer indistinguishability away from the waveguide centre. This can also be seen from the 'no clamp' lines and the W=0 μm values. For increasing values of W, however, the photon infidelity for the two QD positions converges. Thus, the present invention is further advantageous in that the clamp decreases the dependency of the indistinguishability on the spatial position of the QD in the photonic nanostructure. It is to be noted that this cancelling of the position-dependency is with increasing thickness of the clamp in the direction in which the QD position is moved. If the QD was moved downwards in the geometry of FIG. 3, the position-dependency would still be present since there is no clamp on this side of the nanostructure.

Figure 3:
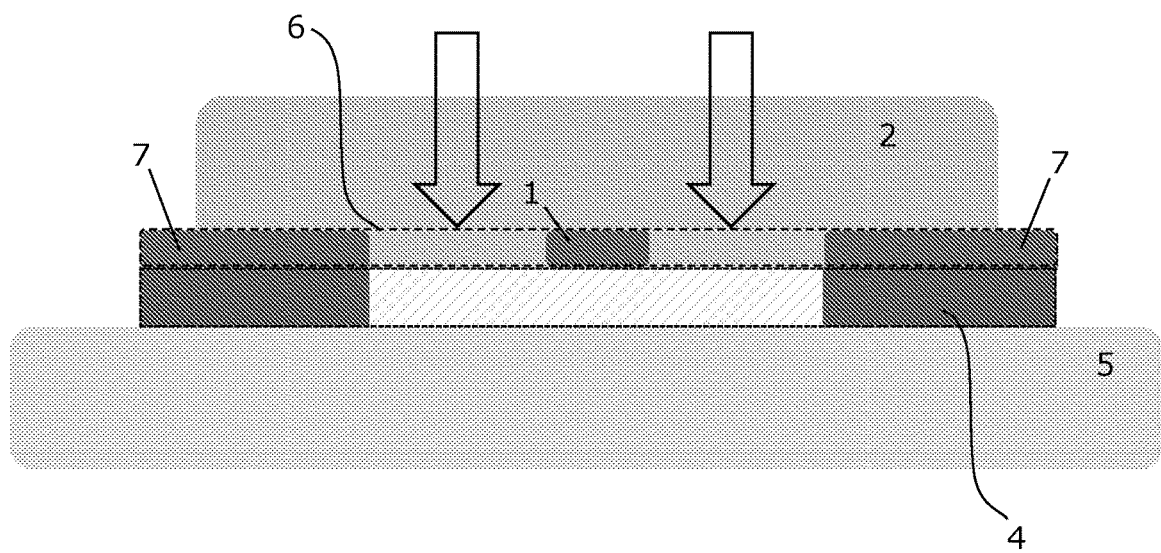
FIG. 3 is a cross sectional view illustrating the formation of a photonic nanostructure and a clamp on a supporting structure.

FIG. 3 illustrates the exemplary fabrication of this embodiment. First, an AlGaAs layer 4 is formed on a substrate 5, typically silicon, and then a GaAs layer 6 is formed on the AlGaAs layer. The GaAs layer is dry-etched at the arrows to form the central nanophotonic waveguide 1 between the remains 7 of the GaAs layer 6. A clamp 2 of SU8 is then deposited to cover both the waveguide and parts of the remains 7—with some openings (not in this cross-sectional plane) providing access to the AlGaAs layer 4. Then the waveguide 1 and clamp 2 are undercut by wet-etching the AlGaAs layer to form a suspended nanophotonic waveguide 1. As can be seen, clamp 2 forms a mechanical connection between the nanostructure 1 and the supporting structure, here remains 7 and substrate 5.

Figure 4A:
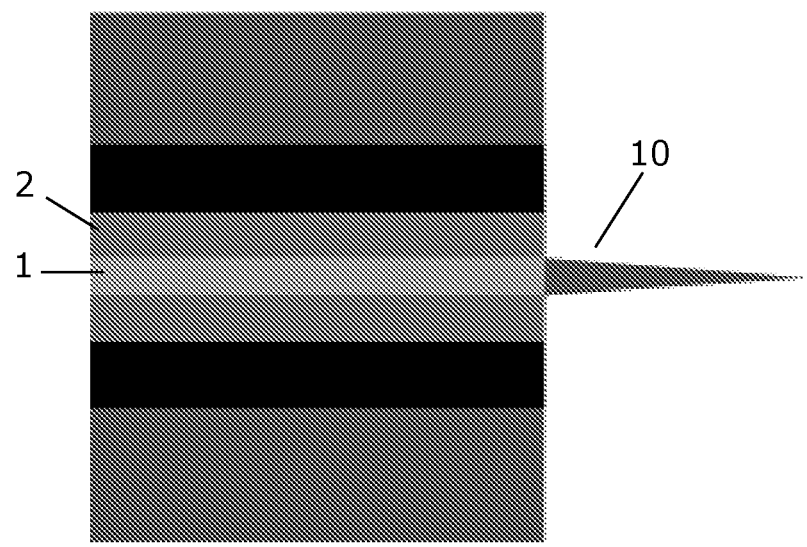
FIGS. 4A-C illustrate top-views of different outcoupling means according to embodiments of the invention, with the under-etched parts being black.
Figure 4B:
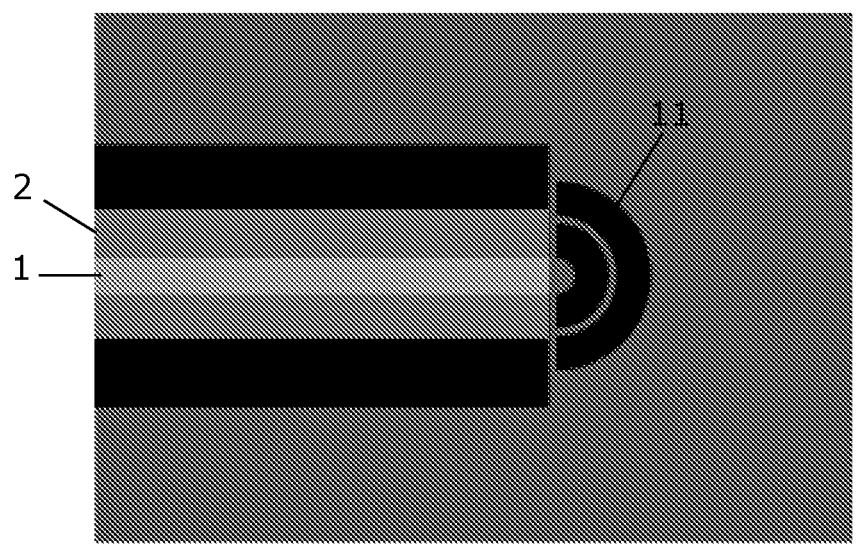
Figure 4C:
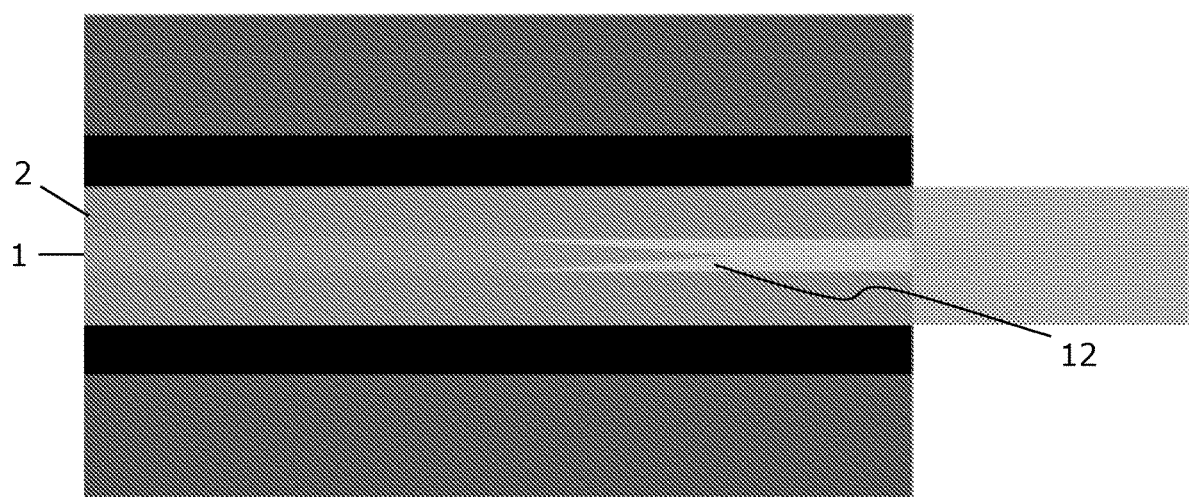

FIGS. 4A-C illustrate different means for coupling out photons emitted by the quantum dot in the photonic nanostructure 1, a tapered waveguide section 10 (FIG. 4A), a grating 11 (FIG. 4B), an evanescent coupler 12 (FIG. 4C), and out-coupling mirror (in the case of a cavity, not shown) or other known ways of coupling out light from a waveguide or cavity. Similarly, means for coupling in photons to excite the QD in the photonic nanostructure e.g. a tapered waveguide section, a grating, evanescent couplers, and in-coupling mirror (in the case of a cavity) or other known ways of coupling light into a waveguide or cavity.

FIG. 4C illustrates a preferred embodiment where the photonic nanostructure is a nanobeam waveguide clamped by a line of clamping material. The out-coupling means is here a tapered section of the nanobeam. In the tapered section, radiation in the single mode of the nanostructure evanescently couples to the line of clamping material which, due to its shape, constitutes a dielectric index-guided waveguide. Because of its larger transverse dimensions, this waveguide enables much easier coupling to e.g. optical fibres typically used in quantum networks.

A coherent single-photon source is expected to be a key foundational hardware component in future quantum communication applications. Applications areas include secure quantum communication (quantum cryptography), quantum simulations of complex quantum systems, and ultimately single photons will be the carrier of quantum information between remote quantum nodes in a large-scale quantum network.

The invention claimed is:

1. A coherent single photon source with wavelength $\lambda$, comprising an elongated, semiconductor photonic nanostructure and a self-assembled quantum dot positioned inside the photonic nanostructure, wherein the photonic nanostructure has a cross-sectional area smaller than 2 $\mu m^2$, wherein the single photon source further comprises an elongated clamp formed in a material that is transparent and has a refractive index smaller than 2 at the wavelength $\lambda$, and, wherein the clamp is mechanically connected to the length of the photonic nanostructure and has a stiffness and a size sufficient to suppress low frequency vibrations ($\omega \leq 10$ GHz) in a combined structure of the clamp and the nanostructure.

2. The coherent single photon source according to claim 1, wherein the stiffness of the clamp is expressed by an averaged Young's modulus for the combined structure, $E_{av}$, and a cross-sectional area of the combined structure, A, and, wherein $E_{av}$ and A are selected in accordance with:
for $E_{av} \in [0$ GPa; 3 GPa$[$, $A \geq 10.5$ $\mu m^2$;
for $E_{av} \in [3$ GPa; 5.5 GPa$[$, $A \geq 7$ $\mu m^2$;
for $E_{av} \in [5.5$ GPa; 70 GPa$[$, $A \geq 1$ $\mu m^2$; and
for $E_{av} \geq 70$ GPa, $A \geq 0.5$ $\mu m^2$.

3. The coherent single photon source according to claim 1, wherein the clamp at least partly surrounds the photonic nanostructure in transverse directions.

4. The coherent single photon source according to claim 3, wherein the photonic nanostructure is embedded in the clamp in transverse directions.

5. The coherent single photon source according to claim 1, further comprising a means for coupling out photons emitted by the quantum dot in the photonic nanostructure.

6. The coherent single photon source according to claim 5, wherein the means for coupling out photons is a single mode nanophotonic waveguide section, which is an extension of the photonic nanostructure and, which is mechanically connected to the clamp along its length and at least partly surrounded by the clamp in transverse directions, the waveguide section being tapered in a direction away from the nanostructure to evanescently couple photons from the single mode to a guided mode in the clamp.

7. The coherent single photon source according to claim 1, further comprising a means for coupling in photons to excite the quantum dot in the photonic nanostructure.

8. The coherent single photon source according to claim 1, wherein the photonic nanostructure is a cavity in that it comprises reflectors at both ends of the nanostructure.

9. The coherent single photon source according to claim 1, wherein the photonic nanostructure is a nanophotonic waveguide that is single-mode at the wavelength $\lambda$.

10. A method for improving the indistinguishability of a single photon source having an elongated, semiconductor photonic nanostructure and a self-assembled quantum dot positioned inside the photonic nanostructure, wherein the photonic nanostructure has a cross-sectional area smaller than 2 $\mu m^2$, the method comprising:
exciting the quantum dot to emit photons; and
increasing the indistinguishability of photons successively emitted into the photonic nanostructure with a clamp formed in a clamping material that is transparent and has a refractive index smaller than 2 at the wavelength $\lambda$, the clamp being mechanically connected to the length of the photonic nanostructure and having a stiffness and a size sufficient to suppress low frequency vibrations ($\omega \leq 10$ GHz) in a combined structure of the clamp and the nanostructure.

* * * * *